United States Patent [19]

Naglestad et al.

[11] Patent Number: 5,481,471
[45] Date of Patent: Jan. 2, 1996

[54] MIXED SIGNAL INTEGRATED CIRCUIT ARCHITECTURE AND TEST METHODOLOGY

[75] Inventors: Mark B. Naglestad, Mission Viejo; Frank J. Bohac, Jr., Laguna Hills; James M. Aralis, Mission Viejo; Bert S. Moriwaki, Laguna Niguel; Frank J. Calabretta, Costa Mesa; Bruce L. Troutman, Aliso Viejo, all of Calif.

[73] Assignee: Hughes Aircraft Company, Los Angeles, Calif.

[21] Appl. No.: 993,268

[22] Filed: Dec. 18, 1992

[51] Int. Cl.⁶ ................................... G06F 11/26
[52] U.S. Cl. ........................... 364/489; 371/22.6
[58] Field of Search ................... 364/488, 489, 364/490, 578; 395/800; 371/22.1, 22.3, 22.5, 22.6

[56] References Cited

U.S. PATENT DOCUMENTS

| | | | |
|---|---|---|---|
| 4,947,365 | 8/1990 | Masubuchi | 364/489 |
| 4,985,860 | 1/1991 | Vlach | 364/578 |
| 5,282,146 | 1/1994 | Aihara et al. | 364/489 |

FOREIGN PATENT DOCUMENTS

0434137A2  12/1990  European Pat. Off. .

OTHER PUBLICATIONS

Author: Madhuri Jarwala "Design for Test Approaches to Mixed–Signal Testing" International Test Conference 1992 Sep. 20, 1992; p. 555.
Author: Kenneth D. Wagner and Thomas W. Williams "Design for Testability of Analog/Digital Networks" IEEE Publications on Industrial Electronics vol. 36, No. 2 May 1989; pp. 227–230.
Mixed Signal Testing Using Analog Scan Design, by R. Hulse, Analog & Mixed Signal Design Conference Proceedings, Oct. 28–30, 1992, p. 244.
Toward An Analog And Mixed–Signal Test Bus Standard, by S. Dollens et al., Analog & Mixed Signal Design Conf. Proceedings, Oct. 28–30, 1992 pp. 204.

*Primary Examiner*—Vincent N. Trans
*Attorney, Agent, or Firm*—M. E. Lachman; M. W. Sales; W. K. Denson-Low

[57] ABSTRACT

An integrated circuit architecture and test methods for use in designing, fabricating and testing mixed-signal application specific integrated circuits. The architecture comprises a plurality of mixed-signal integrated circuits, bidirectional buffers coupled to the integrated circuits that provide for circuit reconfigurability, a bidirectional digital/analog test bus, and a serial test controller coupled to the buffers that controls normal operation and testing of the integrated circuits. The controller and plurality of buffers cooperate to couple signals from signal pads to the integrated circuits to provide for "normal" operation thereof, and to re-route external test signals applied to selected signal pads to the integrated circuits to permit testing. Logic in the buffers provides for functional configurability, enabling them to be logically altered under control of the controller, and allowing the test bus to be connected directly to signal pads. All of the signal pads are available for use in testing, and provide a means of directly accessing key test points within the circuit without resorting test vectors. Test methods are disclosed and comprise: selecting an integrated circuit for testing; selecting signal pads that are to be used to test the selected integrated circuit, which selected signal pads are different from those used during normal operation of the integrated circuit; applying external test signals to the selected signal pads; routing the external test signals by way of the plurality of configurable buffers and the bidirectional bus from the selected signal pads to the integrated circuit; and monitoring input signals and output signals applied to and derived from the selected signal pads to test the selected integrated circuit.

6 Claims, 6 Drawing Sheets

Fig. 7
CONTROLLER TIMING FOR N = 3

Fig. 8

MIXED SIGNAL INTEGRATED CIRCUIT ARCHITECTURE AND TEST METHODOLOGY

BACKGROUND

The present invention relates generally to semiconductor devices and methods, and more particularly, to an integrated circuit architecture and test methodology for use in fabricating and testing mixed signal integrated circuit devices.

Over the last several decades, "design for testability" techniques have been defined that allow integrated circuit logic to be completely controllable and observable. Typical techniques are described in "Mixed-signal testing using analog scan design," by Richard Hulse, and "Toward an analog and mixed-signal test bus standard," by Steve Dollens et al. published in Analog & Mixed Signal Design Conference Proceedings, Oct. 28–30, 1992, at pages 244 and 204, respectively. These well-known techniques include full/partial scan, built-in self test, and massive observability, for example. Unfortunately, these techniques are directed toward digital circuitry and provide no means to allow adequate testing of analog or nonvolatile structures. The concept of testability is important and cannot be overlooked for mixed-signal integrated circuit chips. A new technique is therefore required to allow complete testing of digital, analog, and nonvolatile circuits on the same chip.

Lack of a structured test approach for mixed-signal devices, and the drive to produce high performance, small die size chips, has forced an "ad-hoc" approach to proliferate in the industry. Although this approach requires little silicon overhead and has a minimal performance impact, it may result in chips that have not been sufficiently tested. This approach is not adequate for mixed signal integrated circuit devices. The design of such chips tend not to be die-size and performance-driven; instead, the focus is to quickly provide operational, reliable circuits. Therefore, it is necessary to provide a test methodology to address this changing environment.

The conventional "ad-hoc" approach is typified by the use of integrated standard digital test structures in the logic and special test pads and/or extra circuitry to allow for controllability and observability of the analog and nonvolatile circuits. Unfortunately, this approach is not well structured, documented, or consistent in the design community, and typically translates into unpredictable, higher test development costs.

The assignee of the present invention is currently developing a customized mixed signal application specific integrated circuit (ASIC) design system. This system is cell based and is designed to lessen circuit development time for first-time working silicon. The initial cell library is based upon a nonvolatile CMOS process and is comprised of analog, digital, nonvolatile memory (EEPROM), mask memory (ROMs), volatile memory (RAMs), and microcontroller cells. The design environment includes options that permit designers to implement ASIC designs, including schematic capture, simulation, and test vector generation.

It is therefore an objective of the present invention to provide an architecture and test method for mixed signal integrated circuits that permits operability and testing of the circuits. It is a further objective of the present invention to provide a mixed signal integrated circuit architecture and a test methodology that is integrated into the above-cited ASIC design system.

SUMMARY OF THE INVENTION

The present invention is an integrated circuit architecture and test method that is employed to design, fabricate and test mixed signal application specific integrated circuits. The architecture of the present invention comprises a plurality of mixed-signal functional blocks. A functional block is a group of transistors or devices that is unique and is isolated from other devices and tested separately. All inputs of the functional block are directly controllable and enough outputs are observable to determine the operability of a tested functional block. A plurality of buffers are coupled between a plurality of signal pads and the functional blocks that provide for reconfigurability. A bidirectional digital/analog test bus is coupled between the plurality of buffers and the functional blocks. A serial test controller is coupled to the buffers. The controller and buffers cooperate to couple signals from the signal pads to the functional blocks to provide for "normal" operation thereof, and to re-route external test signals applied to selected ones of the signal pads to the functional blocks by way of the test bus to permit testing thereof.

More specifically, logic has been added to the buffers that provide for functional configurability, thereby enabling them to be logically altered under control of the controller, and allowing the test bus to be connected to selected signal pads used to apply test signals. The selected signal pads provide a means of directly accessing key test points within the circuit without resorting to lengthy, complex test vectors. Moreover, the buffers allow analog signals to be transferred without attenuation.

Given the above mixed signal integrated circuit architecture, an embodiment of the present test method comprises the following steps. Selecting a mixed-signal functional block for testing. Selecting signal pads that are to be used to test the selected mixed-signal functional block, which selected signal pads are different from those used during normal operation of the integrated circuit. Applying external test signals to the selected signal pads. Routing the external test signals by way of the plurality of configurable buffers and the bidirectional bus from the selected signal pads to the mixed signal functional block. Monitoring input signals and output signals applied to and derived from the selected signal pads to test the selected mixed-signal functional block.

The present invention thus provides a structured design/test methodology that reduces test development costs and decreases product time-to-market times. The present invention provides a technically attractive system that enhances wafer test capabilities. The primary benefits of the present invention include: reduced test development costs, (2) more thorough test coverage, (3) and reduced test times.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
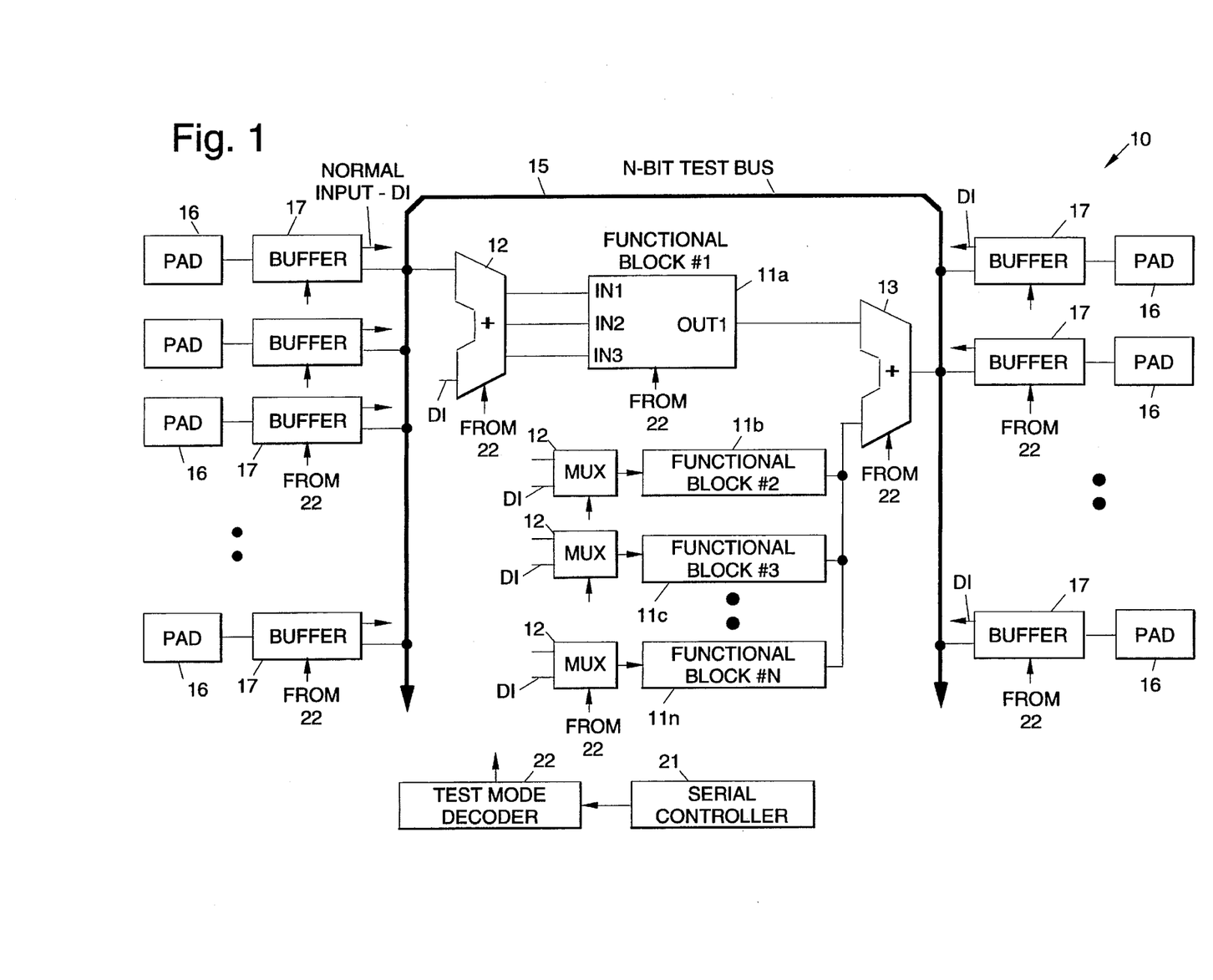
FIG. 1 shows an integrated circuit architecture in accordance with the principles of the present invention.

Referring to the drawing figures, FIG. 1 shows an architecture 10 for a mixed signal integrated circuit in accordance with the principles of the present invention. The architecture 10 is comprised of a plurality of functional blocks 11a–11n that are representative of and which may comprise any of a number of mixed-signal integrated circuits. Such circuits may include analog, digital, nonvolatile memory (EEPROM), mask memory (ROMs), volatile memory (RAMs), or microcontroller cells, for example. A functional block 11 is a group of transistors or devices that is unique and is isolated from other devices and tested separately. All inputs of the functional block 11 are directly controllable and enough outputs are made observable to determine the operability thereof. A first functional block 11a is shown having three inputs IN1–IN3 and an output OUT1. An input multiplexer 12 is coupled to each of the inputs of the first functional block 11a. An output multiplexer 13 is coupled to the output of the first functional block 11a. The outputs of each remaining functional block 11b–11n are also coupled to the output multiplexer 13. Similarly, the inputs of each of the remaining functional blocks 11b–11n are individually coupled to separate input multiplexers 12.

The input multiplexer 12 is coupled to receive "normal inputs" (DI), that are derived from signal pads 16 from which input signals are provided that are coupled to the functional block 11a and provide for normal operation. The normal inputs (DI) are coupled to the functional block 11a by way of a plurality of buffers 17. The input multiplexer 12 is also coupled by way of a bidirectional digital/analog test bus 15 to the signal pads 16 by way of the plurality of buffers 17. The output multiplexer 13 is coupled by way of the test bus 15 to the signal pad 16 by way of the plurality of buffers 17. Controller means is provided that comprises a serial controller 21 coupled to a test mode decoder 22. The test mode decoder 22 is coupled to the plurality of buffers 17 and to the multiplexers 12, 13. The serial controller 21 and test mode decoder 22 are adapted to reconfigure signal paths to and from selected signal pads 16 to selected functional blocks 11 to provide for test mode operation of the functional block 11. The serial controller 21 and test mode decoder 22 also configure the signal paths to provide for normal operation of the mixed-signal integrated circuit.

An example of how the present architecture 10 is used will be described with reference to FIG. 1. The first functional block 11a is to be tested, and may be a low level library primitive cell or combinations of cells, for example. This block 11a is completely controllable and observable since: (1) the selected buffers 17 that function as input and output buffers are configured to impose pad signals directly on the test bus 15, (2) the input multiplexer 12 routes the input signals coupled to the test bus 15 directly to inputs of the first functional block 11a, (3) the output of the first functional block 11a is multiplexed by the output multiplexer 13, along with the other functional blocks 11b–11n, as required, to the test bus 15, and (4) the signals output to the test bus 15 from the functional block 11a are routed directly through the buffers 17 that function as output buffers to the signal pads 16. This configuration provides for complete controllability and observability of any functional block 11, including digital synchronous, digital asynchronous, analog, nonvolatile, and memory type blocks 11.

Logic (described in detail below) is included in the buffers 17 that provide for functional configurability, thereby enabling them to be logically altered, and allowing the bidirectional digital/analog test bus 15 to be connected directly to the signal pads 16. These pads 16 provide an easy way of directly accessing key test points within the functional blocks 11 without resorting to lengthy, complex test vectors. Moreover, the buffers 17 allow analog signals to be transferred through the circuit without attenuation. The details of the present invention are described in more detail below.

In order to fully explain the integrated design/test environment provided by the architecture 10, details regarding the buffers 17 and the serial test controller 21 are described below. Several examples are presented to illustrate the reduction to practice of the present invention. Several types of input/output buffers 17 are included in the cell library that allow direct access to the internal circuitry comprising the functional blocks 11. A key circuit element is a complimentary NMOS/PMOS transmission gate that enables digital and/or analog signals on the test bus 15 or a an signal pad 16 to be transferred virtually unattenuated from or to portions of the the integrated circuit.

Figure 2:
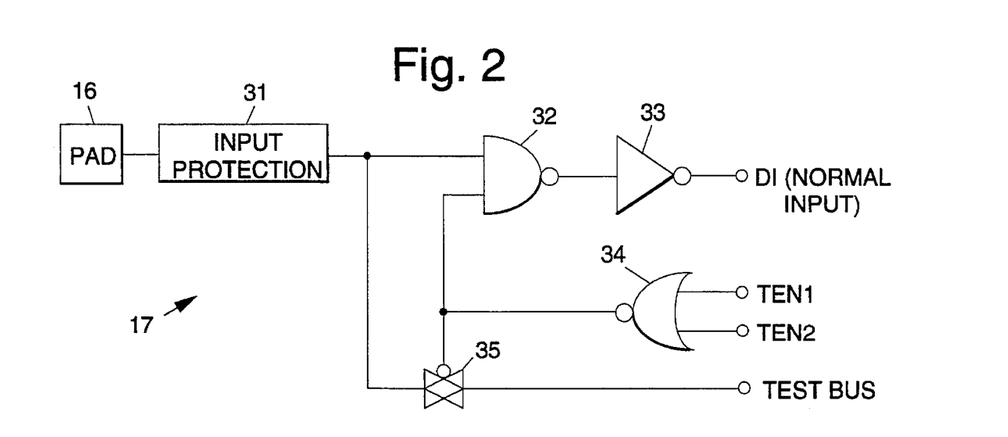
FIG. 2 shows a digital input buffer circuit employed in the integrated circuit architecture of FIG. 1.

An exemplary digital input buffer 17 is shown schematically in FIG. 2. Two test enable inputs, TEN 1 and TEN2, are included to allow the buffer 17 to be configured from multiple control sources. The digital input buffer 17 comprises an input protection circuit 31 that is coupled to the input pad 16. The input protection circuit 31 is coupled to one input of a two input OR gate 32 whose output is coupled to an inverting amplifier 33 whose output provides a data input signal (DI). A NOR gate 34 having two test enable inputs, TEN1 and TEN2 coupled to its inputs has its output coupled to the second input of the OR gate 32 and to a complimentary transmission gate 35. An input to the transmission gate 35 is couped to the test bus 15, while the output thereof is coupled to the first input of the OR gate 32. The following table illustrates the various states of the input buffer 17.

| State | TEN2 | TEN1 | GATE | DI |
|-------|------|------|------|-----|
| 0 | 0 | 0 | OFF | PAD |
| 1 | 0 | 1 | ON | 0 |
| 2 | 1 | 0 | ON | 0 |
| 3 | 1 | 1 | ON | 0 |

In operation, during STATE 0 the buffer 17 operates as a normal input; namely, the data input signal (DI) is functionally identical to the PAD signal at the input pad 16. The transmission gate 35 is inactive and isolates the signal on the test bus 15 from the PAD signal. During STATE 1, STATE 2, and STATE 3 the DI signal is forced to a logic zero level to insure that no subsequent gates consume excess current. The transmission gate 35 is activated and allows the PAD signal to be applied to the test bus 15.

Figure 3:
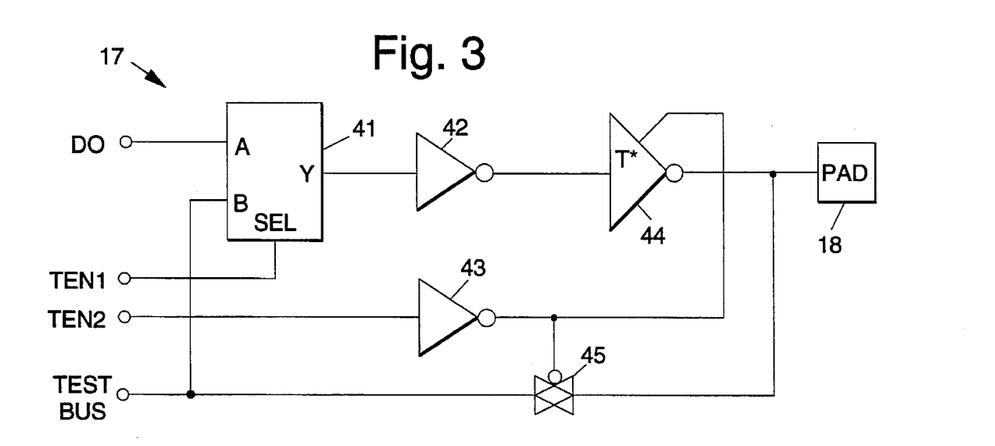
FIG. 3 shows a digital output buffer cell employed in the integrated circuit architecture of FIG. 1.

FIG. 3 shows one embodiment of a digital output buffer 17. A normal buffer has been made tri-statable and includes an analog transmission gate 45. Further, a 2:1 multiplexer circuit 41 has been added to allow either logic (DO) or test bus (TB) data to be routed to a signal pad 16 that provides an output pad. The 2:1 multiplexer circuit 41 is coupled through an inverter 42 to a tri-state inverter 44 to the signal pad 16. A second inverter 43 is coupled from the TEN2 input to the transmission gate 45 and to the tri-state input (T*) of the tri-state inverter 44. The signal pad 16 and the test bus 15 are coupled to the transmission gate 45. The following table illustrates the various states of the output buffer 17.

| State | TEN2 | TEN1 | GATE | PAD | Tri-state buffer |
|---|---|---|---|---|---|
| 0 | 0 | 0 | OFF | DO | ON |
| 1 | 0 | 1 | OFF | TB | ON |
| 2 | 1 | 0 | ON | TB | FLOAT |
| 3 | 1 | 1 | ON | TB | FLOAT |

In operation, during STATE 0 the transmission gate is OFF, thereby isolating the test bus 15 (TB) from the signal pad 16. The output buffer 17 is activated and allows the data out (DO) signal to flow to PAD. During STATE 1, the transmission gate 45 is deactivated. The multiplexer 41 routes the TB signal from the test bus 15 to the output buffer 17 and then to the signal pad 16. STATE 2 or STATE 3 may be used to deactivate the output buffer 17 and connect the test bus 15 to signal pad 16 by way of the transmission gate 45, thereby allowing direct monitoring of internal analog signals.

Figure 4:
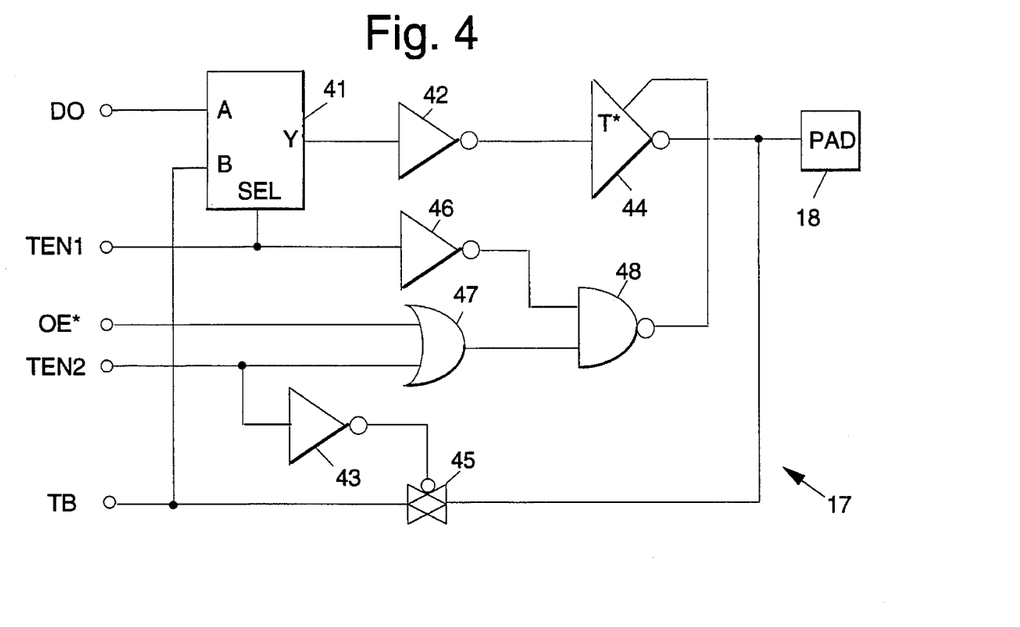
FIG. 4 shows a digital tri-state output buffer employed in the integrated circuit architecture of FIG. 1.

An exemplary digital tri-state output buffer 17 is shown in FIG. 4. The digital tri-state output buffer 17 is comprised of substantially the same components as was described with reference to FIG. 3, but comprises additional logic including a NOR gate 48 a NAND gate 47 and an inverter 46 coupled as shown. The following table illustrates the various states of the digital tri-state output buffer 17.

| State | TEN2 | TEN1 | GATE | pad | Tri-state buffer |
|---|---|---|---|---|---|
| 0 | 0 | 0 | OFF | DO | ON |
| 1 | 0 | 1 | OFF | TB | ON |
| 2 | 1 | 0 | ON | TB | FLOAT |
| 3 | 1 | 1 | ON | TB | ON |

In operation, during normal operation, STATE 0, the DO signal is routed through the multiplexer 41 and remainder of the output buffer 17 onto the signal pad 16 (assuming OE*=0). The transmission gate 45 is deactivated to isolate the test bus 15 and signal pad 16. In STATE 1, the signal on the test bus 15 is multiplexed through the activated output buffer 17 to the signal pad 16 with the transmission gate 45 remaining deactivated. During STATE 2 operation, the output buffer 17 is tri-stated, with the signal on the test bus 15 routed through the transmission gate 45 to the signal pad 16. STATE 3 operation is not allowed since both the the tri-state inverter 44 and transmission gate 45 are activated and may cause signal contention.

Figure 5:
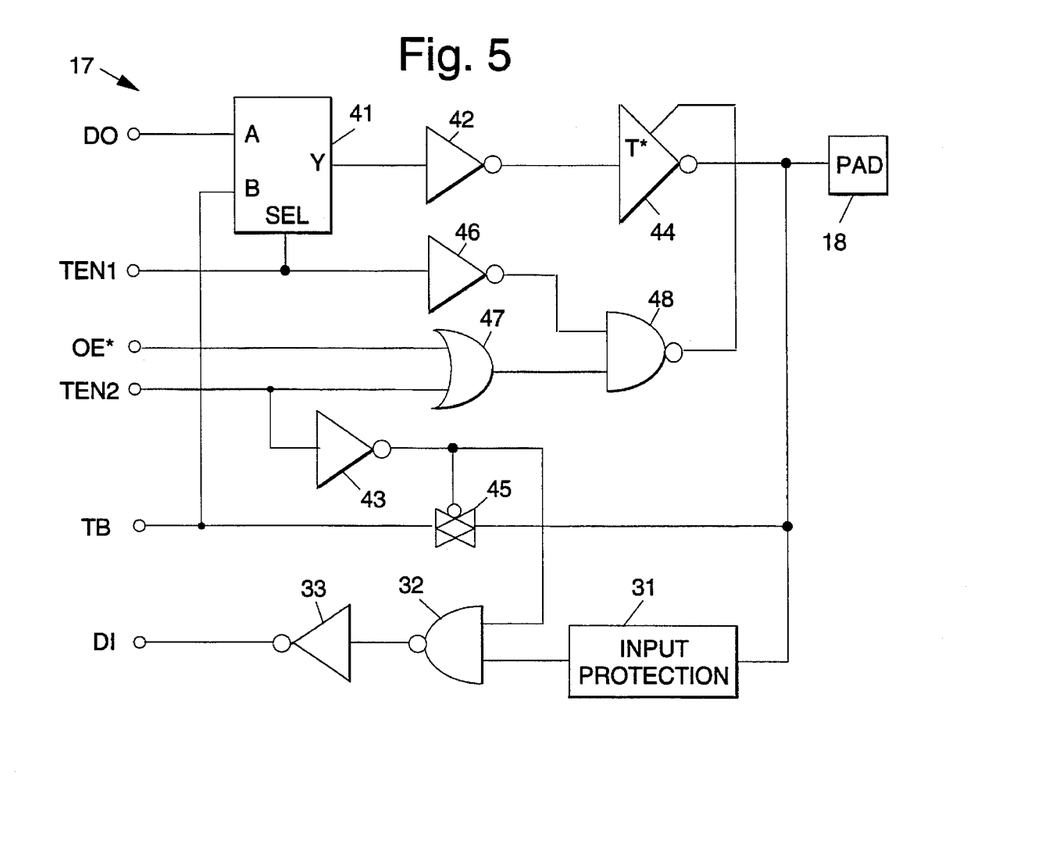
FIG. 5 shows a digital input/output buffer employed in the integrated circuit architecture of FIG. 1.

A digital input/output buffer 17 is shown in FIG. 5 and, in essence, combines the circuits shown in FIGS. 2 and 4. Consequently, the construction of this buffer 17 will not be described. The buffer 17 is bidirectional, in that the DI signal is equal to the signal at the signal pad 16 when the output buffer 17 is deactivated (STATE 0 with OE*=1), and the signal at the signal pad 16 is equal to the DO signal when the circuit is used as an output buffer. The following table illustrates the various states of the digital input/output buffer 17.

| State | TEN2 | TEN1 | GATE | PAD | Tri-state buffer | DI |
|---|---|---|---|---|---|---|
| 0 | 0 | 0 | OFF | DO | ON | DO |
| 1 | 0 | 1 | OFF | TB | ON | TB |
| 2 | 1 | 0 | ON | TB | FLOAT | 0 |
| 3 | 1 | 1 | ON | TB | ON | 0 |

In operation, during STATE 1 the transmission gate 45 is off and isolates the test bus 15 from the signal at the signal pad 16. Additionally, the test bus 15 is routed through the multiplexer 41, through the activated buffer 17, onto the signal pad 16, and back to the data input. STATE 1 connects the test bus 15 to the output signal pad 16 by way of the transmission gate 45 and forces the data input signal (DI) to a known logic zero state. STATE 3 operation is similar to STATE 1 with the exception that the data input signal (DI) is now forced to a logic zero state.

Figure 6:
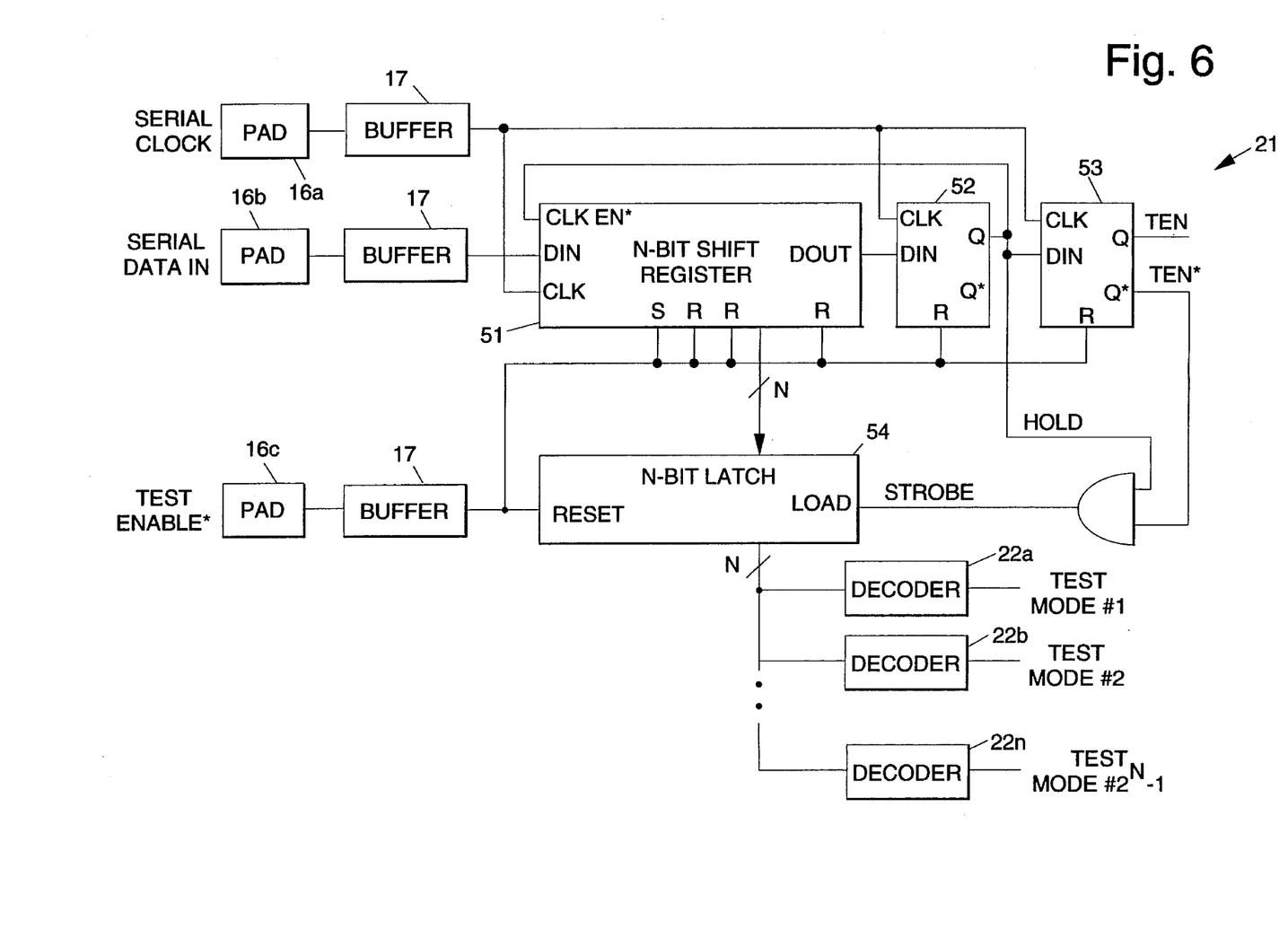
FIG. 6 shows a serial test controller and decoder employed in the integrated circuit architecture of FIG. 1.

The serial test controller 21 and decoder 22 are shown in FIG. 6, and is used to configure the chip for either test or normal mode operation. They are comprised of an N-bit shift register 51, two flip-flops 52, 53, an N-bit latch 54, and a plurality of decoders 22a–22n that enable a user to automatically configure the chip to allow a particular functional block 11 to be accessed directly by way of the pads 16 and test bus 15. Serial logic has been utilized to minimize the addition of test pads 16a, 16b that are required for SERIAL CLOCK and SERIAL DATA IN signals. These pads 16a, 16b are used during the test mode to load the proper test data word into the controller 21 and then operate as normal functional inputs when the chip is not being tested. One additional pad 16c is required for a TEST ENABLE* input that is used to activate or deactivate the serial test controller 21.

Figure 7:
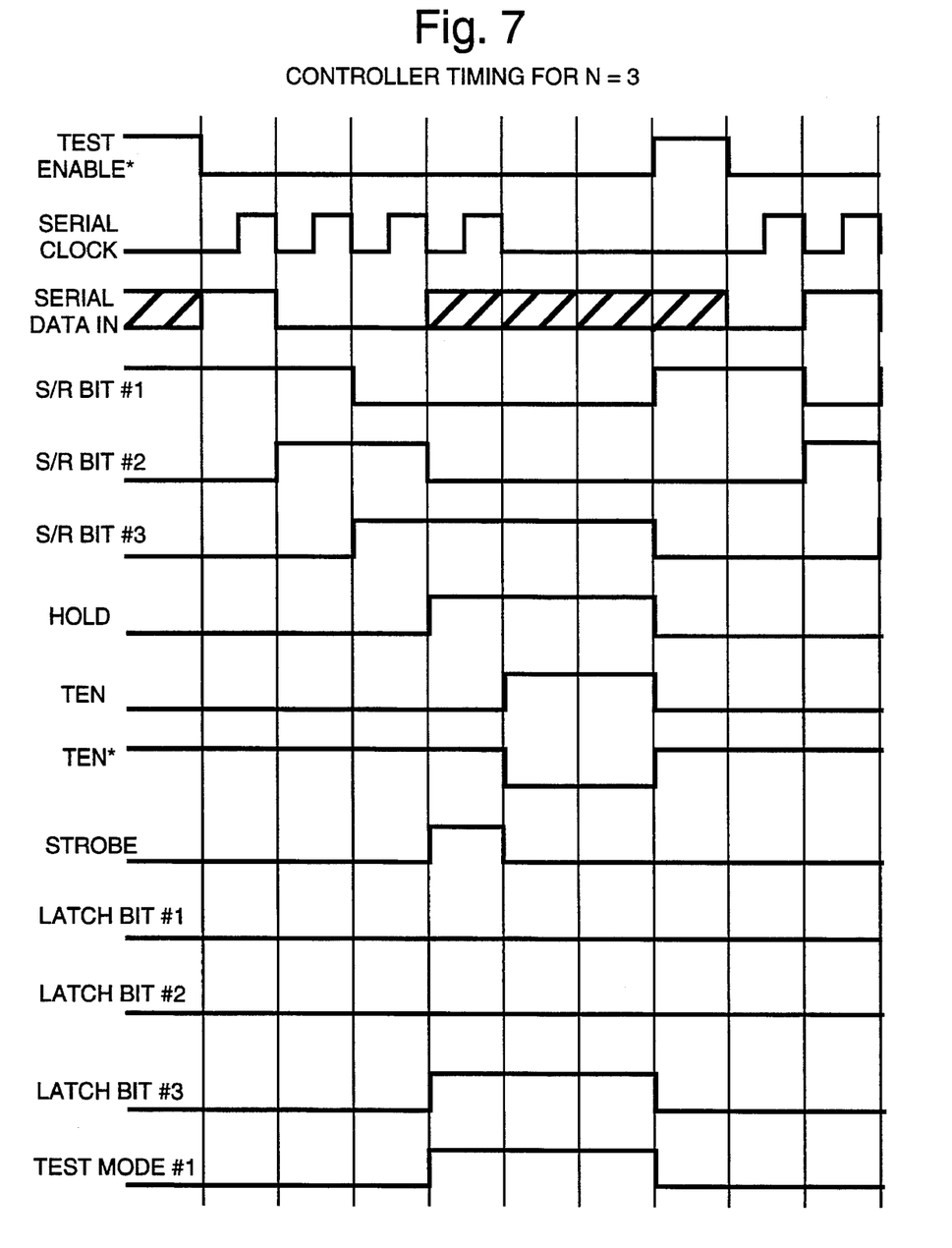
FIG. 7 shows the detailed timing and data vectors illustrating the operation of the serial test controller.

The operation of the test controller 21 is best explained with a simple example. Consider a chip that requires 7 unique test states. This requires 3 bits of shift register (N=3) since the zero latch state represents normal chip operation. FIG. 7 shows the detailed timing and data vectors for this circuit to: (1) enter the test mode, (2) activate the TEST MODE #1 signal, and (3) exit the test mode. Prior to entering the test mode (normal operation), the controller 21 is disabled since TEST ENABLE* is a logic one level. This condition forces a 3-bit register 51 to the "100" state, the HOLD and TEN (test enable) flip-flops 52, 53 to a logic zero, the latch 54 to reset to "000", and the test mode decoder 22 to a logic zero. The leading "1" in the register 51, results from being set by the TEST ENABLE* logic 1 level, and serves as a timing bit to subsequently load the latch 54 and inhibit further data from being loaded into the shift register 51.

To enter the test mode, the user forces TEST ENABLE* to a logic zero, begins clocking the test logic with a SERIAL CLOCK signal, and provides the data input stream, "100", on the SERIAL DATA IN pad 16b. After three clock cycles, the timing bit initiates a STROBE pulse that loads the latch 54 with a "001" (MSB>LSB) code. The output of the latch 54 is then decoded, either locally or globally, to activate the TEST MODE #1 signal. Coincident with STROBE>1, the HOLD signal becomes active and inhibits further internal clocking of the register 51, thereby, causing the register 51 to hold the "001" state.

The chip is reconfigured so that the input and output signals of the chosen functional block 11 are multiplexed to the test bus 15 and routed through the proper input and output signal pads 16, thereby allowing direct access to the functional block 11. Once the functional block 11 is tested, the user forces TEST ENABLE* to a logic one to deactivate TEST MODE #1 and ready the chip for either normal operation or entering the next test mode.

In order to better understand the operation of the present invention, consider the functional block 11 shown in FIG. 1, and assume that it is buried deep within the integrated circuit. In order to minimize test time and maximize test coverage, it is essential that the block 11 be tested directly instead of requiring the chip to undergo a complex sequence of test vectors before cell access is achieved. Specifically, this functional block 11 has two signal inputs IN1, IN2, a bias control input IN3, and a single output OUT. Assume that the chip has ten signal pads 16 coupled to it and two bidirectional input/output buffers 17. First, it is determined which three input signal pads 16 out of the available ten are to be connected to the inputs IN1, IN2, IN3 of the functional block 11 and which bidirectional buffer 17 is to be reconfigured in the test mode to serve as an output buffer 16 for the functional block 11. The serial test controller 21 and decoder reconfigure the circuit to have the proper interconnections, and the circuit may then have test signals applied to the selected three signal pads coupled to the inputs IN1, IN2, IN3 of the functional block 11 and the functionality and parametrics of the functional block 11 are tested.

Figure 8:
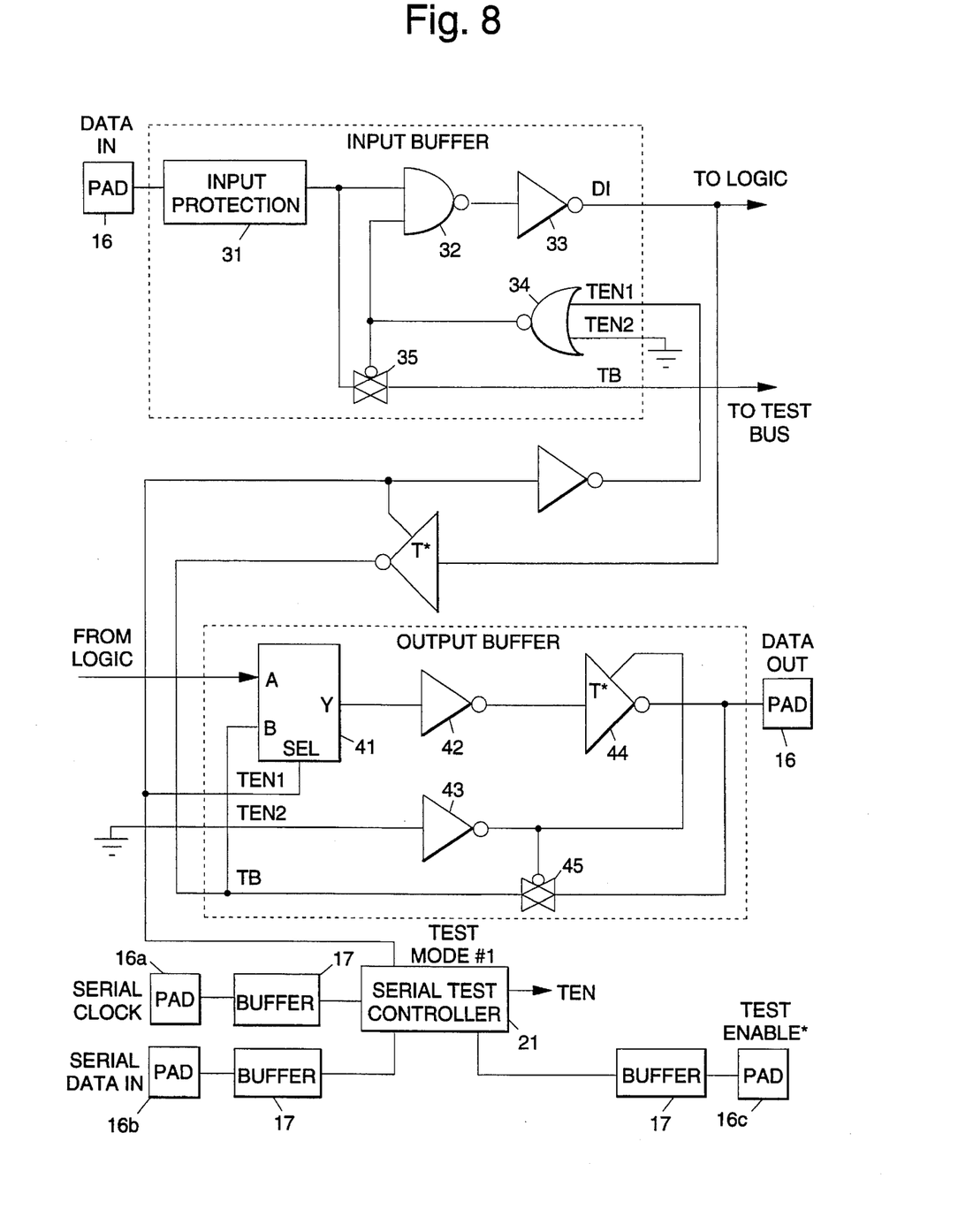
FIG. 8 illustrates testing of an exemplary input/output buffer.

FIG. 8 shows testing of the parametrics of an input/output buffer 17 using input trigger levels (Vil and Vih) and output voltage levels (Vol and Voh). To begin, the appropriate test word is loaded into the serial test controller 21, using the SERIAL DATA IN signal, in order to activate the TEST MODE #1 signal. This enables the DATA IN signal to pass through the NAND gate 32 in the input buffer 17 and inverter 33, and then onto the tri-state inverter 44, and then to the multiplexer 41 in the output buffer 17. From this point, the data travels through another inverter 42, the tri-state inverter 44, and finally to the DATA OUT pad 16. In essence, the DATA OUT signal is the inverted level of the DATA IN signal.

The advantage of using the principles of the present invention for testing buffer parametrics is in the ease of setting up the buffers 17 to the proper state. Without the controllability and observability provided by the present invention, a test engineer would need to find a special set of input vectors that would allow each input transition (0>1 or 1>0) to be independently observed at an output. This problem is magnified when there are many inputs and outputs to be tested. Moreover, to test an output also requires that the chip be stimulated to force the output into both the logic one and logic zero states. The simplicity of the present invention is that inputs and corresponding outputs are checked for parametrics within 2 clock cycles.

Thus there has been described a new and improved an integrated circuit architecture and test methodology for use in fabricating and testing mixed signal integrated circuit devices. It is to be understood that the above-described embodiment is merely illustrative of some of the many specific embodiments which represent applications of the principles of the present invention. Clearly, numerous and other arrangements can be readily devised by those skilled in the an without departing from the scope of the invention.

What is claimed is:

1. A mixed-signal integrated circuit architecture that permits normal operation and test mode operation, and that comprising:

a plurality of mixed-signal integrated circuits, each having predetermined inputs and outputs;

a plurality of signal pads adapted couple signals into and out of each of the plurality of mixed-signal integrated circuits;

a bidirectional digital/analog test bus that is selectably couplable between the plurality of signal pads and the inputs and outputs of the plurality of mixed-signal integrated circuits;

a plurality of configurable buffers individually coupled to the plurality of signal pads and the bidirectional digital/analog test bus, that are adapted to selectively couple input and output signals between predetermined sets of signal pads and corresponding ones of the plurality of mixed-signal integrated circuits to provide for normal operation thereof, and that are adapted to selectively couple test signals between different selectable sets of the signal pads and selected ones of the plurality of mixed-signal integrated circuits by way of the bidirectional digital/analog test bus to provide for test mode operation thereof; and controller means coupled to the plurality of configurable buffers that are adapted to selectively configure the plurality of configurable buffers to provide normal operation and test mode operation of the plurality of mixed-signal integrated circuits;

and wherein the controller means and the plurality of configurable buffers are adapted to selectively reconfigure the function of each of the signal pads to permit the test mode operation of the plurality of mixed-signal integrated circuits.

2. The architecture of claim 1 which further comprises:

a plurality of multiplexers coupled between the plurality of mixed-signal integrated circuits and the plurality of configurable buffers and bidirectional digital/analog test bus, and coupled to the controller means, for selectively coupling the input and output signals between the predetermined sets of signal pads the plurality of mixed-signal integrated circuits to provide for normal operation thereof, and for selectively coupling the test signals between the different selectable sets of the signal pads and the selected ones of the plurality of mixed-signal integrated circuits by way of the bidirectional digital/analog test bus to provide for test mode operation thereof.

3. The architecture of claim 2 wherein the controller means comprises:

a test mode decoder coupled to the plurality of configurable buffers; and a serial test controller coupled to the test mode decoder, to the plurality of multiplexers, and to the plurality of configurable buffers that is adapted to cause the test mode decoder select a particular test mode, and to selectively configure the plurality of configurable buffers to operate the plurality of mixed-signal integrated circuits in the selected test mode.

4. The architecture of claim 1 wherein the controller means comprises:

a test mode decoder coupled to the plurality of configurable buffers; and a serial test controller coupled to the test mode decoder and to the plurality of configurable buffers that is adapted to cause the test mode decoder select a particular test mode, and to selectively configure the plurality of configurable buffers to operate the plurality of mixed-signal integrated circuits in the selected test mode.

5. A method of testing the architecture of claim 1 comprises the steps of:

selecting a mixed-signal integrated circuit for testing;

selecting signal pads that are to be used to test the selected mixed-signal integrated circuit, which selected signal pads are different from those used during normal operation of the mixed-signal integrated circuit;

applying external test signals to the selected signal pads;

routing the external test signals by way of the plurality of configurable buffers and the bidirectional bus from the selected signal pads to the mixed-signal integrated circuit;

monitoring input signals and output signals applied to and derived from the selected signal pads to test the selected mixed-signal integrated circuit.

6. A test method for use with the architecture of claim 1 comprises the steps of:

selecting a mixed-signal integrated circuit for testing;

selecting signal pads that are to be used to test the selected mixed-signal integrated circuit;

causing the controller means to reconfigure the buffers coupled to the selected signal pads to provide signal paths between the selected signal pads and the selected mixed-signal integrated circuit by way of the bidirectional test bus;

applying external test signals to the selected signal pads;

monitoring input signals and output signals applied to and derived from the selected signal pads to observe the functionality of the selected mixed-signal integrated circuit;

and wherein signal paths are routed from predetermined ones of the selected signal pads that function as input pads through the bidirectional test bus to the selected mixed-signal integrated circuit to other predetermined ones of the selected signal pads that function as output pads to test the mixed-signal integrated circuit.

* * * * *